United States Patent [19]

Komagata et al.

[11] Patent Number: 5,714,238
[45] Date of Patent: Feb. 3, 1998

[54] CONDUCTIVE ADHESIVE AND CIRCUIT USING THE SAME

[75] Inventors: Michinori Komagata; Kiminori Yokoyama; Yoshinobu Tanaka; Kenichi Suzuki, all of Niigata, Japan

[73] Assignee: Namics Corporation, Niigata, Japan

[21] Appl. No.: 757,255

[22] Filed: Nov. 27, 1996

[30] Foreign Application Priority Data

Dec. 1, 1995 [JP] Japan .................. 7-313914

[51] Int. Cl.$^6$ .................. B32B 33/00; H01B 1/06
[52] U.S. Cl. .................. 428/208; 428/206; 428/328; 428/414; 428/416; 428/901; 523/200; 523/210; 523/427; 523/442; 525/474; 525/481; 525/489; 252/519.14; 252/519.21; 252/519.33; 252/519.34; 252/521.2; 252/521.5; 156/330
[58] Field of Search .................. 252/513, 519, 252/519.14, 519.21, 519.33, 519.34, 521.2, 521.5; 428/206, 201, 209, 328, 414, 416, 901, 208; 523/200, 210, 427, 440, 442; 156/330; 525/474, 481, 489

[56] References Cited

U.S. PATENT DOCUMENTS

| | | |
|---|---|---|
| 1,427,786 | 9/1922 | Deaton . |
| 1,911,397 | 5/1933 | Saurbrey . |
| 2,329,993 | 6/1943 | Kriner .................. 126/73 |
| 2,560,853 | 4/1951 | Eickmeyer et al. .................. 174/47 |
| 2,671,554 | 11/1954 | Melroe .................. 198/197 |
| 2,742,670 | 9/1956 | Morin .................. 18/30 |
| 2,771,929 | 1/1956 | Alterio et al. .................. 152/222 |
| 3,359,145 | 12/1967 | Salyer et al. .................. 252/519 X |
| 5,166,229 | 11/1992 | Nakano et al. .................. 252/519 X |

*Primary Examiner*—Fred Teskin
*Attorney, Agent, or Firm*—David G. Conlin; Peter F. Corless

[57] ABSTRACT

There is disclosed a conductive adhesive comprising (A) conductive particles having a surface of at least one of nickel and nickel-boron alloy, and the surface of which has been subjected to surface treatment with a mixture of a polyoxyalkylene phosphate compound and a polyoxyalkylenealkyl or polyoxyalkylenealkenyl amine or a derivative thereof;

(B) an epoxy compound which contains a diglycidyl epoxy compound used as a reactive diluent in an amount of 20 to 70 weight % based on the total amount of the epoxy compound; and (C) a phenolic resin hardener which contains at least one of an alkyl resol phenolic resin and alkyl novolak phenolic resin in an amount of 50% by weight or more based on the total amount of the phenolic resin hardener.

16 Claims, No Drawings

CONDUCTIVE ADHESIVE AND CIRCUIT USING THE SAME

BACKGROUND OF THE INVENTION

1. Field of the Invention

This invention relates to a conductive adhesive, more specifically a conductive adhesive which can adhere a semiconductor element, chip parts or discrete parts to a printed wiring board without causing electromigration. Also, the present invention relates to a circuit to which a semiconductor element, etc. is adhered by using the conductive adhesive.

2. Prior Art

As one of practically equipping techniques of a semiconductor, there is a conjunction system using a flip chip system. In the system, by using a semiconductor element in which a bump is formed by solder plating, conjunction of said semiconductor element is carried out by the solder. Also, attempts have been made to conjugate electronic parts by using an anisotropic conductive film with the use of a conductive adhesive containing a noble metal powder such as silver, or a power in which gold, etc. is plated onto the surface of resin balls.

On the other hand, for formation of a circuit using a printed wiring board, solder is used for conjunction of chip parts or discrete parts. It has been also carried out to practically equip these parts by using a conductive adhesive in place of the solder. However, when silver is used as conductive particles of said adhesive, electro-migration will be likely caused (see IEEE Transaction on Components, Packaging and Manufacturing Technology, Part B, Vol. 17, No. 1, p. 83).

At present, for conjunction of electronic parts, eutectic crystal structure solder of lead and time has been used. Thus, when solders used in disposed electronic devices are dissolved by acidic rain and mixed with subterranean water, there is a problem of public health by using the subterranean water as drinking water. Also, for effecting conjunction with solder, a board was washed with a solvent such as fron to remove remaining flux or soldering ball. However, use of such a detergent causes occurrence of a volatile organic compound (VOC) so that use thereof would be severely restricted in the future.

SUMMARY OF THE INVENTION

An object of the present invention is to provide a conductive adhesive which can adhere a semiconductor element, chip parts or discrete parts to a printed wiring board; contains no harmful metal such as lead which becomes causes of pollution when it is disposed; uses a low cost and easily available metal as compared with noble metals such as gold and palladium; causes no migration of metals; contains no solvent or a little amount of solvent; and shows less change in resistance and stable conductivity even when it is allowed to under high temperature conditions after formation of a circuit. Another object of the present invention is to provide a circuit formed on a wiring board which requires no washing and shows stable conductivity.

The present inventors have intensively studied to accomplish the above objects and as a result, they have found that conjunction of a semiconductor element or electronic parts to a printed wiring board is carried out by using a conductive adhesive which comprises a surface treated metal with a specific range, a specific resin and a hardener, the above objects can be accomplished whereby the present invention has completed.

That is, the conductive adhesive of the present invention comprises (A) conductive particles having a surface of at least one of nickel and nickel-boron alloy, and the surface of which has been subjected to surface treatment with a mixture of a polyoxyalkylene phosphate derivative and a polyoxyalkylene-alkyl(or alkenyl) amine or a derivative thereof;

(B) an epoxy compound which contains a diglycidyl type epoxy compound used as a reactive diluent in an amount of 20 to 70 weight % based on the total amount of the epoxy compound; and (C) a phenolic resin hardener which contains at least one of an alkyl resol type phenolic resin and alkyl novolak type phenolic resin in an amount of 50% by weight or more based on the total amount of the phenolic resin hardener.

Also, the circuit of the present invention comprises a semiconductor element, chip parts, discrete parts or a combination thereof being adhered onto a wiring board by using the conductive adhesive as mentioned above.

DESCRIPTION OF THE PREFERRED EMBODIMENTS

In the conductive adhesive of the present invention, the conductive particles to be used as Component (A) are those in which metal particles are subjected to surface treatment. As the metal particles, there may be used metal particles comprising nickel and/or nickel-boron alloy or metal particles surfaces of which are plated by nickel and/or nickel-boron alloy. In the case of plated metal particles, plating may be carried out onto the surface of the above metal particles with another metal or alloy mutually, or may be carried out onto the surface of other metal particles than the above, preferably copper particles. By using such metal particles, an adhesive composition having conductivity without causing migration and having advantages in economy and safety. Among the metal particles, preferred are particles of nickel or a nickel-boron alloy, or copper particles plated by a nickel-boron alloy. In the latter case, when the plating layer is thin, the base material is exposed during use to likely cause migration so that the thickness of the plating layer is preferably 0.1 µm or more.

The shape of the metal particles may be sphere or scaly, or may be other shape such as needle.

The scaly metal particles have an average diameter at the flat surface, i.e., the average of a long diameter and a short diameter being generally 0.5 to 30 µm, preferably 2 to 10 µm. If the average diameter is less than 0.5 µm, particles are likely oxidized whereby the conductive particle becomes metal oxide which is an insulating material. On the other hand, it exceeds 30 µm, at the time of printing, a print or board causes clogging. An aspect ratio of the particles is generally 10 to 300, preferably 20 to 50. If the aspect ratio is less than 10, an effect of preventing sedimentation of conductive particles by formulating scaly metal particles becomes insufficient, while if it exceeds 200, clogging will likely occur.

A formulation amount of the scaly metal particles is, in a total amount including conductive particles which are not subjected to surface treatment formulated depending on necessity, generally 2% by volume or more based on the total volume of the conductive particles, preferably 2 to 65% by volume, more preferably 5 to 40% by volume. If it is less than 2% by volume, sedimentation of conductive particles during preservation is remarkable and contact resistance changes with a lapse of time.

Spherical metal particles have an average particle size of generally 0.1 to 30 µm, preferably 1 to 10 µm. Incidentally, in the spherical metal particles, a spherical particle having needle-like projects on the surface thereof such as nickel powder produced by the carbonyl method is included. If the average particle size is less than 0.1 μm, thixotropic property becomes remarkably large and a uniform layer can hardly be formed. Also, when a conductive adhesive containing such fine metal particles is compared with those containing conductive particles having the same volume fraction, the former adhesive has a large contact resistance. In addition, when printing the adhesive, a stain of a plate is likely remained. On the other hand, if the average particle size exceeds 30 μm, the particles are likely settled and separated during storage. Also, clogging of a plate is likely caused at printing whereby working property is bad. A formulation amount of the spherical metal particles is, including conductive particles in which a surface treatment is not carried out which are added depending on necessity, generally 98% by volume or less, preferably 35 to 98% by volume, more preferably 60 to 95% by volume based on the total conductive particles. If the amount exceeds 98% by volume, conductive particles are likely settled from an uncured conductive adhesive or a conductive paste containing a solvent.

One of the characteristic features of the present invention is to apply a surface treatment to the metal particles with a surface treating agent comprising a mixture of a polyoxyalkylene phosphate (i.e., phosphoric acid ester) derivative and a polyoxyalkylenealkyl(or alkenyl) amine or a derivative thereof in order to prevent increasing a relative resistivity (specific resistance) by oxidation of the metal particles at a high temperature.

The polyoxyalkylene phosphate derivative is representatively a surfactant represented by the following formula:

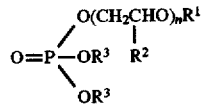

wherein $R^1$ represents an alkyl group or an alkenyl group each having 8 to 22 carbon atoms, or an alkylphenyl group which has an alkyl group having 4 to 12 carbon atoms; $R^2$ represents a hydrogen atom or a methyl group; $R^3$ represents a hydrogen atom, a lower alkyl group or a $(CH_2CHR^2O)_nR^1$ chain; and n is a number which makes the total number of the $CH_2CHR^2O$ unit 2 to 30.

As $R^1$, there may be mentioned a straight or branched alkyl group such as octyl, nonyl, decyl, dodecyl, tridecyl, tetradecyl, hexadecyl, octadecyl, eicosyl, docosyl, etc.; an alkenyl group such as oleyl; and an alkylphenyl group such as octylphenyl, nonylphenyl, dodecylphenyl, etc. $R^2$ is a hydrogen atom or a methyl group, and both may be copresent in the molecule when n is a plural number. A plural number of $R^3$'s may be the same or different in the molecule, and there may be exemplified by, in addition to a hydrogen atom, a lower alkyl group preferably having 1 to 6 carbon atoms, more preferably 1 to 3 carbon atoms, such as methyl, ethyl, propyl, etc.; and it may be the above-mentioned $(CH_2CHR^2O)_nR^1$ chain. When two or more $(CH_2CHR^2O)_nR^1$ chains are present in the molecule, n's may be the same or different with each other, and n is so selected that the total number of n or the total number of $CH_2CHR^2O$ unit being 2 to 30, preferably 2 to 20. The number of the polyoxyalkylene hydrocarbon chain may be either of 1 to 3 or may be a mixture thereof. In the following, the polyoxyethylene chain is abbreviated to as "POE" and the polyoxypropylene chain as "POP", and the number of the unit are described in the parentheses.

Examples of such polyoxyalkylene phosphate derivatives may include an alkylpolyoxyalkylene phosphate such as bis-(POE(3) lauryl ether)phosphoric acid, bis(POE(5) lauryl ether)phosphoric acid, tris(POE(7) tridecyl ether)phosphoric acid, POE(5) cetyl ether phosphoric acid, tris(POE(8) stearyl ether)phosphoric acid, bis(POE(2)POP(6) stearyl ether) phosphoric acid, etc. an alkenylpolyoxyalkylene phosphate such as bis(POE(5) oleyl ether)phosphoric acid; and an alkylphenylpolyoxyalkylene phosphate such as bis(POE(6) octyl phenyl ether)phosphoric acid, bis(POE(4) nonyl phenyl ether)phosphoric acid, bis(POP(2) octyl phenyl ether) phosphoric acid, etc., and a mixture of these derivatives in which a kind of the alkyl group and/or the number of the polyoxyalkylene hydrocarbon chain is/are different from each other may be used.

The polyoxyalkylenealkyl (or alkenyl) amine or derivative thereof is representatively a surfactant represented by the following formula:

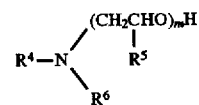

wherein $R^4$ represents an alkyl group, an alkenyl group or an N-alkylaminoalkyl group each having 8 to 22 carbon atoms; $R^5$ represents a hydrogen atom or a methyl group; $R^6$ represents a hydrogen atom or a $(CH_2CHR^5O)_mH$ chain; and m is a number which makes the total number of the $CH_2CHR^5O$ unit 4 to 30.

As $R^4$, there may be mentioned a straight or branched alkyl group such as octyl, nonyl, decyl, dodecyl, tridecyl, tetradecyl, hexadecyl, octadecyl, eicosyl, docosyl, etc.; an alkenyl group such as oleyl; and an N-alkylaminoalkyl group such as N-stearylaminopropyl, etc. $R^5$ is a hydrogen atom or a methyl group, and both may be copresent in the molecule when m is a plural number. $R^6$ may be either a hydrogen atom or the above-mentioned $(CH_2CHR^5O)_mH$ chain. When two $(CH_2CHR^5O)_mH$ chains are present in the molecule, m's may be the same or different with each other, and m is so selected that the total number of m or the total number of $CH_2CHR^5O$ unit being 4 to 30, preferably 4 to 20. The number of the polyoxyalkylene chain may be either 1 or 2 or may be a mixture thereof.

Examples of such a polyoxyalkylenealkyl(or alkenyl) amine or derivatives thereof may include a polyoxyalkylenealkyl amine such as POE(5) lauryl amine, POE(10) lauryl amine, POE(7) cetyl amine, POE(5) stearyl amine, POE(10) stearyl amine, diPOE(15) stearyl amine, POP(5) stearyl amine, etc.; a polyoxyalkylenealkenyl amine such as POE(5) oleyl amine, POE(15) oleyl amine, POP(5) oleyl amine, etc.; and polyoxyalkylenealkyl amine derivatives such as diPOE (6) laurylpropylene diamine, diPOE(8) stearylpropylene diamine, etc., and a mixture of these amines and/or a derivative thereof in which a kind of the alkyl group and/or the number of the polyoxyalkylene hydrocarbon chain is/are different from each other may be used.

A mixing ratio of the polyoxyethylene phosphate derivative and the polyoxyethylenealkyl(or alkenyl) amine or a derivative thereof is preferably so set as to become the acid value equivalent of the former and the amine value equivalent of the latter being equal to neutralize with each other. The ratio may vary depending on the kinds of the both components but generally the latter is within the range of 0.3 to 1 in weight ratio per the former as 1.

An amount of the surface treating agent is generally within the range of 0.1 to 5% by weight, preferably 0.5 to 3% by weight based on the total weight of the metal particles to be supplied to the surface treatment. If the amount is less than 0.1% by weight, oxidation resistance of the surface of the conductive particles cannot be obtained while if it exceeds 5% by weight, adhesion strength of the composition is lowered.

Surface treatment of the metal particles can be carried out by mixing the surface treating agent with the metal particles in dry or wet system; or firstly forming a paste by mixing untreated metal particles, an epoxy resin, a phenolic resin and, if necessary, a solvent, and then mixing the paste with the above-mentioned surface treating agent. The temperature at the treatment may be a normal temperature or an optional temperature under heating.

The amount of Component (A) is 30 to 45% by volume, preferably 32 to 40% by volume in the conductive adhesive, which correspond to 65 to 85% by weight, preferably 70 to 80% by weight. If it is less than 30% by volume, an amount of the conductive particles is little so that a relative resistivity becomes high. On the other hand, if it exceeds 40% by volume, printing property becomes poor, and a coated film after curing becomes rough whereby a relative resistivity becomes high.

In the present invention, in addition to Component (A), conductive particles which comprise nickel and/or nickel-boron alloy in which a surface treatment is not conducted by using such a surfactant may be formulated, if necessary.

Shape and size of the non-treated conductive particles are the same as those mentioned in the metal particles which are to be used as Component (A). If the non-treated conductive particles have too small particle size or have a large aspect ratio in the case of scaly conductive particles, a conductive adhesive containing such particles increases contact resistance by oxidation of the surface when it is exposed to high temperature during curing procedure or use. The ratio of Component (A) in the whole conductive particles is preferably 80% by weight or more. If it is less than 80% by weight, characteristic feature of the present invention that the conductive adhesive is exposed to high temperature, change in resistance is little cannot be sufficiently obtained.

The epoxy compound (B) to be used in the present invention acts as a binder of the conductive adhesive, which is cured by the phenolic resin (C). In the present specification, the terms "epoxy resin" mean an epoxy resin including an epoxy compound having two or more glycidyl groups and used as a reactive diluent. The epoxy compound (B) comprises 20 to 70% by weight, preferably 25 to 60% by weight of a diglycidyl type reactive diluent (epoxy reactive diluents) based on the total weight of Component (B) in order to provide an excellent flowability to the uncured conductive adhesive which contains no solvent or contains a little amount of a solvent, i.e., 5% by weight or less, and to provide an excellent adhesiveness to the conductive adhesive and mechanical properties to the same after curing. If the amount is less than 20% by weight, flowability of the adhesive before curing is insufficient so that workability is poor, while if it exceeds 70% by weight, adhesiveness and mechanical properties of the coated film after curing become poor. Also, the amount of said reactive diluent is preferably 50% by weight or less based on the total weight of Component (B) and Component (C) mentioned hereinbelow. If the amount exceeds 50% by weight, curing property is lowered, and resistance of the adhesive layer after curing is high and easily changed by a temperature.

As the diglycidyl type epoxy reactive diluent, preferred are diglycidyl compounds such as polyethylene glycol diglycidyl ether, poly(2-hydroxypropylene)glycol diglycidyl ether, polypropylene glycol diglycidyl ether, 1,4-cyclohexanedimethanol diglycidyl ether and 1,3-bis(3-glycidoxypropyl)-1,1,3,3-tetramethyldisiloxane since they can provide flexibility to a coated film after curing, and excellent heat cycle resistance and stable conductivity can be obtained. That is, among the reactive diluents, the diglycidyl compound is preferably contained in an amount of 35% by weight, more preferably 50% by weight. As the other diglycidyl type reactive diluent, butanediol diglycidyl ether, neopentyl glycol diglycidyl ether, diglycidyl aniline, etc. are exemplified. Also, a small amount of a triglycidyl ether type reactive diluent such as trimethylolpropane triglycidyl ether and glycerin triglycidyl ether may be used in combination.

If necessary, a monoglycidyl ether type reactive diluent such as n-butylglycidyl ether, etc. may be used in combination, but when the compound is used with a much amount, electric properties or adhesiveness is/are lowered. Thus, an amount thereof is generally 10% by weight or less, preferably 5% by weight or less.

Among Component (B), as the epoxy compound except for the above-mentioned reactive diluent, a bisphenol A type epoxy resin, a bisphenol F type epoxy resin, a novolak type epoxy resin, an alicyclic type epoxy resin, etc. may be used singly or in combination. For providing excellent adhesive property and mechanical property to the conductive adhesive while using the above-mentioned reactive diluent, it is preferred to use a bisphenol A type or bisphenol F type epoxy resin. Also, for providing a flowability suitable for coating operation to the conductive adhesive before curing by using the reactive diluent in an amount as little as possible and/or an allowable amount of a solvent, it is particularly preferred to use a bisphenol A type epoxy resin or a bisphenol F type epoxy resin each of which is a liquid state at normal temperature.

The phenolic resin (C) to be used in the present invention is a curing agent for Component (B), and after curing, it integrally forms a binder with Component (B) after curing. As Component (C), any material which is a phenolic resin initial condensate used as a curing agent of an epoxy resin may be used, and it may be a resol type or novolak type, or a styrene-hydroxystyrene copolymer may be also used. For obtaining an adhesive in which stress is relaxed at the time of curing with excellent heat cycle resistance, 50% by weight or more based on the total amounts of the binder components is preferably an alkyl resol type or alkyl novolak type phenolic resin such as o-cresol novolak phenolic resin. If the amount is less than 50% by weight, stress at curing is large and heat cycle resistance is poor. Also, in the case of the alkyl resol type phenolic resin, to obtain an excellent printing property, the weight average molecular weight (Mw) thereof is preferably 500 or more in the case of alkyl novolak type phenolic resin, more preferably 2,000 or more. If the average molecular weight is less than 500, printing property is lowered and printing failure such as blur is likely caused. In these alkyl resol type or alkyl novolak type phenolic resin, as the alkyl group, those having 1 to 18 carbon atoms may be used and those having 2 to 10 carbon atoms such as ethyl, propyl, butyl, pentyl, hexyl, octyl, nonyl and decyl are preferred.

An amount of Component (C) may vary depending on the kind of Component (B) and Component (C) to be used but to obtain an excellent stability in resistance at a high temperature after curing, the weight ratio of Component (B) and Component (C) is preferably within the range of 4:1 to 1:4, more preferably 4:1 to 1:1.

Also, the total amount of Components (B) and (C) is preferably 55 to 70% by volume, more preferably 60 to 68% by volume based on the total volume of the conductive adhesive, which correspond to preferably 15 to 35% by weight, more preferably 20 to 30% by weight. If it is less than 55% by volume, printing property is poor and stability in resistance at a high temperature becomes poor, while if it exceeds 70% by volume, required relative resistivity cannot be obtained.

The conductive adhesive of the present invention can be used as a conductive paste without any solvent since it contains a reactive diluent. However, depending on necessity, a solvent is added to dissolve the epoxy resin and the phenolic resin, and the material is used by preparing it in the form of a conductive paste in which conductive particles are dispersed. As the solvent, there may be mentioned, depending on the kind of the resin, an aromatic hydrocarbon such as toluene, xylene, mesitylene and tetralin; an ether such as tetrahydrofuran; a ketone such as methyl ethyl ketone, methyl isobutyl ketone, cyclohexanone and isophorone; a lactone such as 2-pyrrolidone and 1-methyl-2-pyrrolidone; an ether alcohol such as ethylene glycol monomethyl ether, ethylene glycol monoethyl ether, ethylene glycol monobutyl ether, diethylene glycol monomethyl ether, diethylene glycol monoethyl ether and diethylene glycol monobutyl ether, and a propylene glycol derivative corresponding thereto; an ester such as an acetic acid ester corresponding to the above; and a diester such as methyl ester, ethyl ester, etc. of a dicarboxylic acid such as malonic acid and succinic acid. An amount of the solvent to be used is optionally selected depending on the kind and weight ratio of the conductive particles and organic resins to be used, and on a method of printing the conductive paste, etc.

Also, as the dispersing aid, an aluminum chelating compound such as diisopropoxy(ethylacetacetato)aluminum; a titanic acid ester such as isopropyltriisostearoyl titanate; an aliphatic group polyvalent carboxylic acid ester; an unsaturated aliphatic acid amine salt; a surfactant such as sorbitan monooleate; or a polymer compound such as a polyester amine salt, a polyamide, etc.

Into the conductive adhesive or conductive paste of the present invention, in addition to the above, a curing catalyst such as an amine and an imidazole, a silane coupling agent, a leveling agent, etc. may be formulated, if necessary.

The conductive adhesive or the conductive paste of the present invention can be prepared by mixing components to be formulated uniformly by an auto mortar, a propeller stirrer, a kneader, rolls, etc. and printing or coating on a substrate by an optional method such as a screen printing, a gravure printing, dispense, etc. When an organic solvent is used, after printing or coating, said solvent is volatilized at room temperature or under heating. When the conductive adhesive of the present invention is printed or coated by the above-mentioned method as such, it is not necessary to effect the step of removing the solvent. After printing or coating, the epoxy resin is cured, for example, at 150° to 200° C. to form a conductive circuit at a necessary portion of the substrate surface.

As mentioned above, by using the conductive adhesive of the present invention, a circuit in which at least one kind of a semiconductor element, chip part and discrete part is conjugated can be formed on the substrate surface.

The conductive adhesive of the present invention is excellent in flowability, capable of printing or coating onto a circuit substrate easily, causes no migration even when a voltage is applied, and less changes in resistance when it is used at high temperature. Also, it is advantageous in the points of economy and safety since it can be easily available, uses metal particles which do not cause pollution and does not use any organic solvent or uses less amount thereof.

The conductive adhesive of the present invention is extremely available for conjunction or practical application of a semiconductor or electronic parts using the above advantages and formation of a microelectronic circuit can be advantageously carried out by using the same.

EXAMPLES

In the following, the present invention is described in more detail by referring to Examples and Comparative examples but the present invention is not limited by these Examples. In the following Examples and Comparative examples, evaluation was carried out by the methods shown below.

(1) Relative resistivity

A coating film obtained by curing a conductive adhesive was measured by using an LCR meter at a room temperature of 20±3° C. and a relative humidity of 50±15% (at initial). Also, after allowing the coated film at 150° C. for 1,000 hours to stand, the same measurement was carried out (after allowing to high temperature).

(2) Adhesion strength of resistor

A chip resistor with a size of 3216 was adhered to a copper-laminated glass-epoxy substrate by using a conductive adhesive and the adhesive was cured by heating. Then, strength necessary for peeling the adhered material was measured by pricking it with a push-pull gauge (Type PGD II, trade name, produced by Marubishi Kagaku Kikai Seisakusho, Japan) from the side portion and reading the value.

(3) Capacitance, dielectric loss tangent and adhesion strength of condenser

A laminated chip condenser with a size of 20125 with a nominal 1,000 pF was adhered to a copper-laminated glass-epoxy substrate by using a conductive adhesive, and the adhesive was cured by heating. As for the thus prepared chip condenser, a capacitance and dielectric loss tangent were measured by using a LCR meter. Further, by pricking it from the side portion to measure the strength necessary for peeling the chip condenser.

(4) Thermal cycling test

A conductive adhesive cured on the surface of a substrate was applied to 5,000 cycles of thermal cycling test one cycle of which comprises 125° C. for 30 minutes and −40° C. for 30 minutes. After completion of the test, presence or absence of cracking or peeling was observed.

Reference Example

As a surface treating agent, 100 parts by weight of tris-[POE(7)tridecyl ether]phosphoric acid and 50 parts by weight of a mixture comprising POE(10)stearyl amine and di-POE(10)stearyl amine with a weight ratio of 2:1 were used by mixing. That is, the treating agent was so prepared that the total amount of both components became 10% by weight by diluting with methyl ethyl ketone. The above surface treating agent was spread to sphere nickel particles having an average particle size of 5 μm while stirring by using a V mixer with an amount of 1% by weight based on the total weight of the nickel particles. Stirring was continued at room temperature for 30 minutes to coat the surface of the nickel particles with the surface treating agent to obtain surface-treated sphere nickel particles.

Examples 1 to 7

By using triple roll mill, conductive particles, epoxy resins, phenolic resins and other components shown in Table 1, and 1 part of imidazole as a curing accelerator and 0.5 part of isopropyltriisostearoyl titanate as a dispersing aid are formulated and mixed until becoming uniform to prepare conductive adhesives.

Comparative Examples 1 and 2

In the same manner as in Examples 1 to 7, conductive adhesives were prepared. Incidentally, the adhesive of Comparative example 1 is an adhesive using untreated nickel powder alone as metal particles, and that of Comparative example 2 is an adhesive using a novolak phenolic resin having no alkyl group as the phenolic resin.

TABLE 1

| | (parts by weight) | Examples | | | | | | | Comparative examples | |
|---|---|---|---|---|---|---|---|---|---|---|
| | | 1 | 2 | 3 | 4 | 5 | 6 | 7 | 1 | 2 |
| Comp-position | Surface treated sphere nickel particles 1* | 69 | 70 | 70 | 70 | 68 | 70 | 70 | | 70 |
| | Untreated sphere nickel particles *2 | | | | | | | | 69 | |
| | Untreated scaly nickel particles *3 | 8 | 7 | 7 | 7 | 8 | 8 | 5 | 8 | 5 |
| | Bisphenol A type epoxy resin *4 | 7.5 | 7.5 | | | 4 | 7.5 | | 7.5 | |
| | Bisphenol F type epoxy resin *5 | | | 10 | 10 | 5 | | 10 | | 10 |
| | Epoxy reactive diluent 1 *6 | 8 | | | | 4 | 5 | 8 | 8 | 3 |
| | Epoxy reactive diluent 2 *7 | | 8 | | 4 | 4 | | | | |
| | Epoxy reactive diluent 3 *8 | | | 8 | 4 | | | | | |
| | Epoxy reactive diluent 4 *9 | | | | | | 2 | | | 5 |
| | Alkyl resol type phenolic resin *10 | | | 5 | 5 | | | | | |
| | Alkyl novolak type phenolic resin *11 | 4 | 7.5 | | | 7 | 4 | 7 | 4 | |
| | Novolak type phenolic resin *12 | 3.5 | | | | | 3.5 | | 3.5 | 7 |
| | Diethylene glycol monobutyl ether | | | | | | 3 | 2 | | |

(Note)
*1 average particle size: 5 μm, prepared by Reference example.
*2 average particle size: 5 μm,
*3 average particle size 5 μm, thickness: 0.3 μm,
*4 molecular weight (Mw): 380, liquid state,
*5 molecular weight (Mw): 340, liquid state,
*6 poly(2-hydroxypropylene)glycol diglycidyl ether,
*7 1,4-cyclohexane dimethanol diglycidyl ether,
*8 1,3-bis(3-glycidoxypropyl)-1,1,3,3-tetramethyl disiloxane,
*9 neopentylglycol diglycidyl ether,
*10 molecular weight (Mw): 3,000,
*11 molecular weight (Mw): 600,
*12 molecular weight (Mw): 550.

When viscosities at 25° C. of the thus prepared conductive adhesives were measured, the results shown in Table 2 were obtained. These adhesives were so printed by screen printing as to conjugate the adhesives on the surface of a copper-laminated glass-epoxy substrate on which a chip resistor and a laminated condenser are placed. The respective materials were cured by heating at 150° C. for 10 minutes, and adhesion strength of the chip resistor, capacitance, dielectric loss tangent and adhesion strength of the laminated condenser were measured.

Separately, the above-mentioned mixtures were each printed on the surface of an aluminum substrate and cured similarly as mentioned above. Volume resistivities of the resulting samples at an initial stage and after allowed to stand at high temperature were measured.

Further, the above-mentioned mixtures were each printed on the surface of a copper-laminated glass-epoxy substrate and cured by heating at 150° C. for 10 minutes. The resulting samples were applied to thermal cycling test and evaluated. These results are summarized in Table 2.

Comparative Example 3

For comparison, a laminated condenser was conjugated to the surface of a copper-laminated glass-epoxy substrate by using solder at heating conditions of 220° C. for 2 minutes, and its capacitance, dielectric loss tangent and adhesion strength were measured. The results are also shown in Table 2.

TABLE 2

| | Examples | | | | | | | Comparative examples | | |
|---|---|---|---|---|---|---|---|---|---|---|
| | 1 | 2 | 3 | 4 | 5 | 6 | 7 | 1 | 2 | 3 |
| Viscosity, 25° C. (Pa·s) | 160 | 120 | 120 | 120 | 140 | 100 | 90 | 190 | 120 | — |
| Resistor Adhesion strength (kg) | 2.0 | 2.0 | 1.5 | 1.7 | 2.0 | 2.0 | 1.7 | 2.0 | 2.0 | — |
| Condenser | | | | | | | | | | |
| Capacitance (pF) *1 | 1,060 | 1,060 | 1,060 | 1,060 | 1,060 | 1,060 | 1,060 | 950 | 1,060 | 1,060 |
| tan δ (%) | 2.1 | 2.2 | 2.2 | 2.2 | 2.2 | 2.1 | 2.2 | 2.5 | 2.1 | 2.2 |

TABLE 2-continued

|  | Examples | | | | | | | Comparative examples | | |
|---|---|---|---|---|---|---|---|---|---|---|
|  | 1 | 2 | 3 | 4 | 5 | 6 | 7 | 1 | 2 | 3 |
| Adhesion strength (kg) | 1.2 | 1.3 | 1.3 | 1.3 | 1.3 | 1.3 | 1.3 | 1.3 | 1.3 | 1.3 |
| Relative resistivity ($\Omega$-cm) | | | | | | | | | | |
| Initial | $3 \times 10^{-3}$ | $6 \times 10^{-3}$ | $8 \times 10^{-3}$ | $1 \times 10^{-3}$ | $1 \times 10^{-2}$ | $3 \times 10^{-3}$ | $4 \times 10^{-2}$ | $1 \times 10^{-1}$ | $4 \times 10^{-3}$ | — |
| Allowed to stand at high temperature | $5 \times 10^{-3}$ | $7 \times 10^{-3}$ | $1 \times 10^{-2}$ | $2 \times 10^{-3}$ | $2 \times 10^{-2}$ | $5 \times 10^{-3}$ | $6 \times 10^{-2}$ | $5 \times 10^{-1}$ | $6 \times 10^{-3}$ | — |
| Thermal cycling test *2 | ◯ | ◯ | ◯ | ◯ | ◯ | ◯ | ◯ | ◯ | X | — |

(Note)
*1 nominal 1,000 pF
*2 ◯: Good, X: Cracking

As clearly seen from Table 2, when the conductive adhesives of the present invention are used, circuits can be formed by conjugating electronic parts with the same adhesion strength as that of the solder. Also, there is no bad effect on the capacitance or dielectric loss tangent of the condenser.

The conductive adhesives of the present invention show excellent conductivity of relative resistivity being $10^{-4}$ to $10^{-2}$ $\Omega$.cm, and even when they are allowed to stand at high temperature for a long period of time, there is no significant change in relative resistivity. To the contrary, in the conductive adhesive of Comparative example 1, relative resistivity is large and conductive particles are oxidized at high temperature so that increase in relative resistivity after allowing to stand at high temperature is remarkable. Also, in the conductive adhesive of Comparative example 2, it caused cracking by thermal cycling test.

We claim:

1. A conductive adhesive which comprises
   (A) conductive particles having a surface of at least one selected from nickel and nickel-boron alloy, and the surface of which has been subjected to surface treatment with a mixture of a polyoxyalkylene phosphate compound and a polyoxyalkylenealkyl or polyoxyalkylenealkenyl amine or a derivative thereof;
   (B) an epoxy compound which contains a diglycidyl epoxy compound used as a reactive diluent in an amount of 20 to 70 weight % based on the total amount of the epoxy compound; and
   (C) a phenolic resin hardener which contains at least one of an alkyl resol phenolic resin and alkyl novolak phenolic resin in an amount of 50% by weight or more based on the total amount of the phenolic resin hardener.

2. The conductive adhesive according to claim 1, wherein the conductive particles have sphere shape having an average diameter of 0.1 to 30 μm or scaly shape having an average of a long diameter and a short diameter of 0.5 to 30 μm.

3. The conductive adhesive according to claim 2, wherein said conductive particles having scaly shape have an aspect ratio of 10 to 200.

4. The conductive adhesive according to claim 3, wherein said conductive particles having scaly shape are formulated in an amount of 2 to 65% by volume based on the total volume of the conductive particles.

5. The conductive adhesive according to claim 2, wherein said conductive particles having sphere shape are formulated in an amount of 35 to 98% by volume based on the total volume of the conductive particles.

6. The conductive adhesive according to claim 1, wherein said polyoxyalkylene phosphate derivative is represented by the formula:

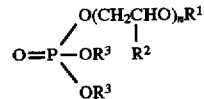

wherein $R^1$ represents an alkyl group or an alkenyl group each having 8 to 22 carbon atoms, or an alkylphenyl group which has an alkyl group having 4 to 12 carbon atoms; $R^2$ represents a hydrogen atom or a methyl group; $R^3$ represents a hydrogen atom, a lower alkyl group or a $(CH_2CHR^2O)_nR^1$ chain; and n is a number which makes the total number of the $CH_2CHR^2O$ unit 2 to 30, and said polyoxyalkylenealkyl(or alkenyl) amine is represented by the formula:

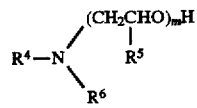

wherein $R^4$ represents an alkyl group, an alkenyl group or an N-alkylaminoalkyl group each having 8 to 22 carbon atoms; $R^5$ represents a hydrogen atom or a methyl group; $R^6$ represents a hydrogen atom or a $(CH_2CHR^5O)_m^H$ chain; and m is a number which makes the total number of the $CH_2CHR^5O$ unit 4 to 30.

7. The conductive adhesive according to claim 6, wherein said polyoxyalkylene phosphate derivative is at least one selected from the group consisting of bis(POE(3) lauryl ether)phosphoric acid, bis(POE(5) lauryl ether)phosphoric acid, tris(POE(7) tridecyl ether)phosphoric acid, POE(5) cetyl ether phosphoric acid, tris(POE(8) stearyl ether) phosphoric acid, bis(POE(2)POP(6) stearyl ether) phosphoric acid, bis(POE(5) oleyl ether)phosphoric acid, bis(POE(6) octyl phenyl ether)phosphoric acid, bis(POE(4) nonyl phenyl ether)phosphoric acid and bis(POP(2) octyl phenyl ether)phosphoric acid wherein POE represents polyoxyethylene and POP represents polyoxypropylene; and said polyoxyalkylenealkyl(or alkenyl) amine is at least one selected from the group consisting of POE(5) lauryl amine, POE(10) lauryl amine, POE(7) cetyl amine, POE(5) stearyl amine, POE(10) stearyl amine, diPOE(15) stearyl amine, POP(5) stearyl amine, POE(5) oleyl amine, POE(15) oleyl amine, POP(5) oleyl amine, diPOE(6) laurylpropylene diamine, diPOE(8) stearylpropylene diamine wherein POE and POP have the same meanings as defined above.

8. The conductive adhesive according to claim 1, wherein Component (A) is formulated in an amount of 65 to 85% by weight based on the total weight of the conductive adhesive.

9. The conductive adhesive according to claim 1, wherein said diglycidyl epoxy compound of Component (B) is at least one selected from the group consisting of polyethylene glycol diglycidyl ether, poly(2-hydroxypropylene)glycol diglycidyl ether, polypropylene glycol diglycidyl ether, 1,4-cyclohexanedimethanol diglycidyl ether and 1,3-bis(3-glycidoxypropyl)-1,1,3,3-tetramethyldisiloxane.

10. The conductive adhesive according to claim 1, wherein Component (B) other than the diglycidyl epoxy compound is at least one selected from the group consisting of a bisphenol A epoxy resin, a bisphenol F epoxy resin, a novolak epoxy resin and an alicyclic epoxy resin, each of which are a liquid state at normal temperature.

11. The conductive adhesive according to claim 1, wherein Component (C) is at least one selected from the group consisting of an alkyl resol phenolic resin having an average molecular weight of 500 or more and having 1 to 18 alkyl carbon atoms and an alkyl novolak phenolic resin having 1 to 18 alkyl carbon atoms.

12. The conductive adhesive according to claim 1, wherein the total amount of Components (B) and (C) is 15 to 35% by weight based on the total weight of the conductive adhesive.

13. The conductive adhesive according to claim 1, wherein the total amount of Components (B) and (C) is 20 to 30% by weight based on the total weight of the conductive adhesive.

14. The conductive adhesive according to claim 1, wherein the weight ratio of Component (B) and Component (C) is within the range of 4:1 to 1:4.

15. The conductive adhesive according to claim 1, wherein the weight ratio of Component (B) and Component (C) is within the range of 4:1 to 1:1.

16. A circuit which comprises a semiconductor element, chip parts, discrete parts or a combination thereof being adhered onto a wiring board by using the conductive adhesive claimed in claim 1.

* * * * *